United States Patent
Sonoda

[19]

[11] Patent Number: 6,088,776

[45] Date of Patent: Jul. 11, 2000

[54] BURST CLOCK MEMORY CIRCUIT

[75] Inventor: Yukio Sonoda, Tokyo, Japan

[73] Assignee: NEC Corporation, Tokyo, Japan

[21] Appl. No.: 09/014,352

[22] Filed: Jan. 27, 1998

[30] Foreign Application Priority Data

Jan. 27, 1997 [JP] Japan .................................. 9-012529

[51] Int. Cl.$^7$ .............................................. G06F 12/00
[52] U.S. Cl. ........................................ 711/167; 713/400
[58] Field of Search ........................... 711/167; 713/400, 713/501, 600

[56] References Cited

U.S. PATENT DOCUMENTS

| | | | |
|---|---|---|---|
| 5,034,962 | 7/1991 | Yamamoto et al. ...................... | 375/222 |
| 5,475,440 | 12/1995 | Kobayashi et al. ...................... | 348/498 |
| 5,502,752 | 3/1996 | Averbuch et al. ....................... | 375/377 |
| 5,642,487 | 6/1997 | Flynn et al. ............................. | 711/167 |
| 5,815,689 | 9/1998 | Shaw et al. .............................. | 713/400 |
| 5,946,712 | 8/1999 | Lu et al. .................................. | 711/167 |

FOREIGN PATENT DOCUMENTS 61-189042 8/1986 Japan .
4-297936 10/1992 Japan .

*Primary Examiner*—Do Hyun Yoo
*Assistant Examiner*—Nasser Moazzami
*Attorney, Agent, or Firm*—Ostrolenk, Faber, Gerb & Soffen, LLP

[57] ABSTRACT

A memory circuit for processing a data signal, supplied together with a write clock signal from a counterpart station, into a processed signal. The data signal is stored in a first memory in response to the write clock signal. A first clock producing circuit produces a first clock signal which is synchronous with the write clock signal and has a transmission rate obtained by averaging that of the write clock signal. The first clock signal is of a burst clock form and supplied to the first memory to make the first memory output the data signal therefrom. A local processing circuit is responsive to the first clock signal and processes the data signal, outputted from the first memory, into the processed signal which is supplied to a signal processing circuit.

5 Claims, 2 Drawing Sheets

6,088,776

BURST CLOCK MEMORY CIRCUIT

BACKGROUND OF THE INVENTION

The present invention relates to a memory circuit for processing a data signal, supplied from a counterpart station, into a processed signal supplied as an input signal to a signal processing circuit. The input signal is used for carrying out a predetermined processing operation in a manner known in the art.

Upon transmission from one communication device to another, it is necessary to use clock signals which have the same transmission rate and are synchronous with one another.

Referring to FIG. 1, there is shown a transmission between conventional communication devices in a communication system known in the art. A subject station SS and a counterpart station CS have the same structure and represent the communication devices. To explain transmission from the counterpart station CS to the subject station SS, a structure of only the subject station SS is shown, while a structure of the counterpart station CS and an explanation about transmission from the subject station SS to the counterpart station CS is omitted.

The subject station SS comprises a memory 1 and a signal processing circuit 2. In the communication system, the transmission from the counterpart station CS to the subject station SS is carried out at a given fixed transmission rate. In the subject station SS, a data signal S is received from the counterpart station CS and a clock signal CLK is received at the same transmission rate with and synchronous with the data signal S. These signals are used to carry out writing successively into the memory 1. The data signal S written into the memory 1 is read out successively from the memory 1 in response to the clock signal CLK and then outputted to the signal processing circuit 2. The signal processing circuit 2 processes the data signal S and writes the result of processing into the memory 1 in response to occurrences of necessity.

As the well-known techniques relating to the general clock phase synchronization and the general memory control, a clock phase synchronization device disclosed in Japanese Patent Publication (laid-open) No. 61-189042 and a memory control circuit disclosed in Japanese Patent Publication (laid-open) No. 4-297936, for example, may be cited.

In the foregoing communication system, each of the subject station and the counterpart station has, in general, an interface function corresponding only to the given fixed transmission rate and carries out transmission according to that given transmission rate. Thus, if a data signal is transmitted at other than the foregoing given transmission rate or a fluctuation in transmission rate is caused at least in one of the subject and counterpart stations, the quality of the data signal is degraded.

SUMMARY OF THE INVENTION

It is therefore an object of the present invention to provide a memory circuit which is capable of dealing with a desired transmission rate and ensuring the stable quality of a data signal upon transmission from a counterpart station to a subject station.

Other objects of this invention will become clear as the description proceeds.

A memory circuit to which this invention is applicable is for processing a data signal, supplied from a counterpart station, into a processed signal supplied to a signal processing circuit which is for carrying out a predetermined processing operation as regards the input signal. The memory circuit comprises a first memory connected to the counterpart station and supplied with a write clock signal together with the data signal for storing the data signal in response to the write clock signal and a first clock producing circuit connected to the first memory for producing a first clock signal which is synchronous with the write clock signal and has a transmission rate obtained by averaging that of the write clock signal. In the memory circuit, the first clock signal is of a burst clock form and is supplied to the first memory to make the first memory output the data signal. The memory circuit further comprises a local processing circuit connected to the signal processing circuit, the first memory, and the first clock producing circuit and responsive to the first clock signal for processing the data signal into the processed signal.

DESCRIPTION OF THE PREFERRED EMBODIMENT

Figure 2:
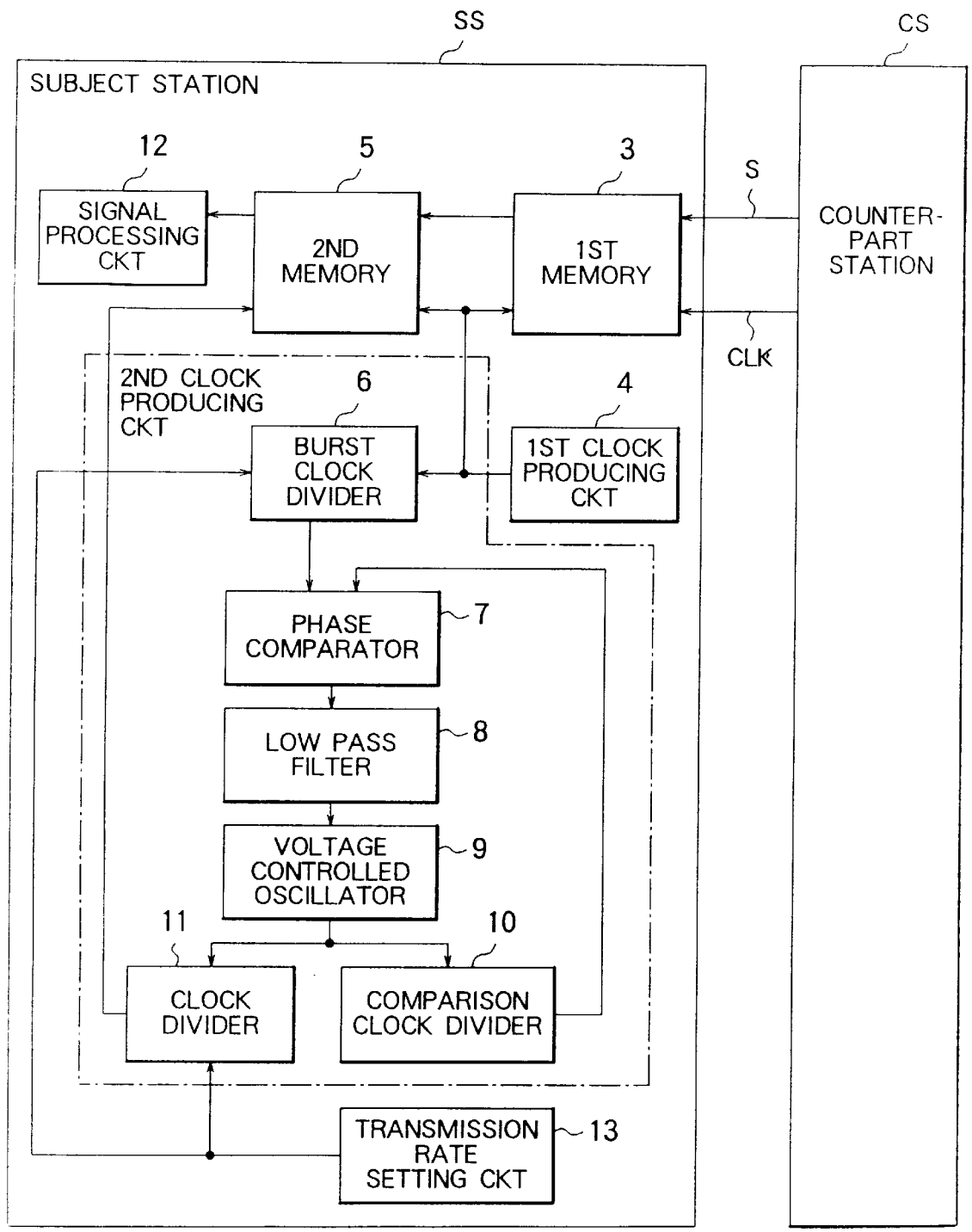
FIG. 2 is a block diagram showing a schematic structure of a communication system for explaining transmission between communication devices each having a burst clock memory circuit according to a preferred embodiment of the present invention.

Referring now to FIG. 2, description will be made as to a memory circuit according to an embodiment of the present invention. In the following description, the memory circuit will be called a burst clock memory circuit because a burst clock signal is used in writing and reading of a memory part included in the memory circuit.

Figure 1:
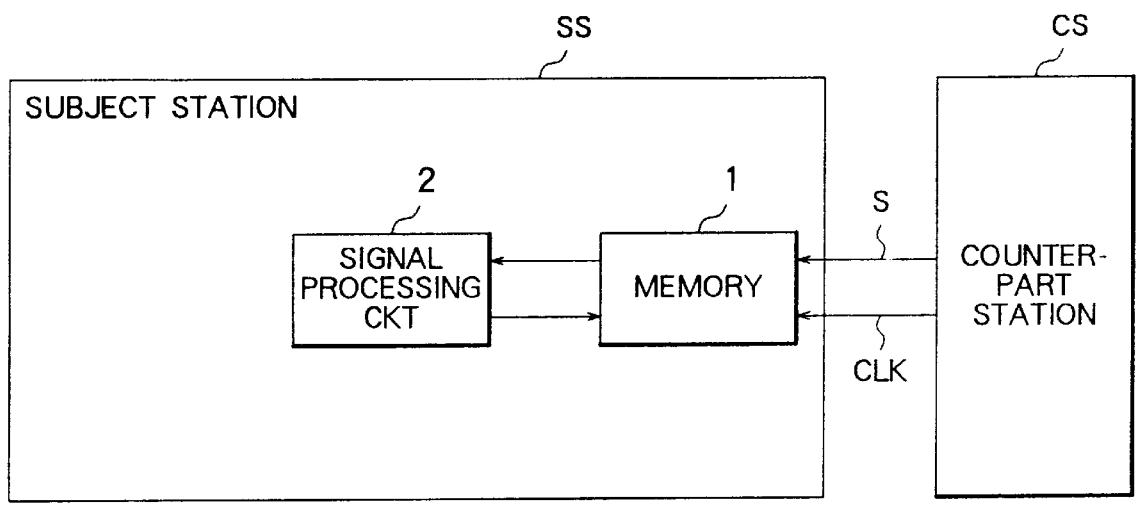
FIG. 1 is a block diagram showing a schematic structure of a communication system for explaining transmission between conventional communication devices.

Like in FIG. 1, a subject station SS and a counterpart station CS have the same structure and represent the communication devices. In explaining transmission from the counterpart station CS to the subject station SS, a structure of only the subject station SS is shown. The structure of the counterpart station CS and an explanation about transmission from the subject station SC to the counterpart station CC is omitted. Further, it is assumed that the communication from the counterpart station CS to the subject station SC is carried out at a given desired fixed transmission rate.

In the communication device of the subject station SS, the burst clock memory circuit process a data signal, supplied from the counterpart station CS, into a processed signal supplied to a signal processing circuit 12. The signal processing circuit 12 carries out a predetermined processing operation on the processed signal in a manner known in the art.

The burst memory circuit comprises a first memory 3 which is connected to the counterpart station CS and is for successively writing a data signal S from the counterpart station CS in response to a write clock signal CLK transmitted at the same transmission rate with and synchronous with the data signal S. The first memory 3 outputs a read enabling signal when the written data amount reaches a half of the whole storage capacity of the first memory 3.

The burst clock memory circuit further comprises a first clock producing circuit 4 which is connected to the first memory 3 and produce a first clock signal in response to the read enabling signal. The first clock signal is synchronous with the write clock signal CLK and has a transmission rate obtained by averaging the write clock signal CLK. The first clock producing circuit 4 reads out the data signal successively per fixed storage unit from the first memory 3 using the first clock signal.

The burst clock memory circuit further comprises a second memory 5 which is connected to the first memory 3 and the first clock producing circuit 4 and is for successively writing the data signal read out from the first memory 3, using the foregoing first clock signal.

The burst clock memory circuit further comprises a transmission rate setting circuit 13 and a burst clock divider 6. The transmission rate setting circuit 13 is for outputting a transmission rate setting signal indicative of transmission rate setting information corresponding to a transmission rate. The burst clock divider 6 is connected to the transmission rate setting circuit 13 and the first clock producing circuit 4. The burst clock divider 6 receives, from the transmission rate setting circuit 13 in the form of the transmission rate setting signal, the transmission rate setting information. The transmission rate setting information represents transmission rate obtained by averaging the foregoing read enable clock signal and is used to divide the write clock signal by a preset dividing ratio to produce and output a divided clock signal.

The burst clock memory circuit further comprises a phase comparator 7, a low pass filter 8, a voltage controlled oscillator 9, and a comparison clock divider 10. The phase comparator 7 is connected to the burst clock divider 6 and the comparison clock divider 10. The phase comparator 7 carries out a phase comparison between the divided clock signal and a later-described phase comparison divided clock signal to output a phase comparison signal. The low pass filter 8 is connected to the phase comparator 7 and is for removing high-frequency components from the phase comparison signal to output a characteristic control signal. The voltage controlled oscillator 9 is connected to the low pass filter 8 and produces a control clock signal in response to the characteristic control signal. The comparison clock divider 10 is connected to the voltage controlled oscillator 9 and divides the control clock signal to a transmission rate equal to that of the divided clock signal to produce the phase comparison divided clock signal.

The burst clock memory circuit further comprises a clock divider 11 which is connected to the voltage controlled oscillator 9 and the transmission rate setting circuit 13. The clock divider 11 receives from the transmission rate setting circuit 13 in the form of the transmission rate setting signal, the transmission rate setting information representing a transmission rate obtained by averaging the foregoing read enable clock signal, to divide the control clock signal by a preset dividing ratio. The clock divider 11 produces a second clock signal which is supplied to the second memory 5 and makes the second memory 5 output the data signal as the processed signal. In other words, the data signal is successively read out from the second memory 5. A combination of the burst clock divider 6, the phase comparator 7, the low pass filter 8, the voltage controlled oscillator 9, the comparison clock divider 10, and the clock divider 11 will be referred to as a second clock producing circuit. A combination of the second clock producing circuit, the second memory 5, and the transmission rate setting circuit 13 is referred to as a local processing circuit.

Specifically, in the foregoing communication system, the data signal S from the counterpart station is successively written into the first memory 3 of the burst clock memory circuit in the communication device of the subject station according to the write clock signal CLK transmitted at the same transmission rate with and synchronous with the data signal S. The first memory 3 outputs the read enabling signal only when the successively written data amount reaches a half of the whole storage capacity of the first memory 3. Accordingly, when the successively written data amount is less than a half of the whole storage capacity, the first memory 3 does not output the read enabling signal.

The first clock producing circuit 4 produces the first clock signal using the read enabling signal outputted from the first memory 3 and uses it as the first clock signal for the first memory 3 so as to successively read out the data signal per fixed storage unit from the first memory 3. In this case, since the read enabling signal is outputted according to the written data amount in the first memory 3, the read clock signal produced at the first clock producing circuit 4 is in the form of the burst clock signal. The second memory 5 uses the first clock signal outputted from the first clock producing circuit 4 as the write clock signal to successively write the data signal read out from the first memory 3.

The burst clock divider 6 receives from the transmission rate setting circuit 13 the transmission rate setting information representing the transmission rate obtained by averaging the first clock signal outputted from the first clock producing circuit 4, and divides the write clock signal by the preset dividing ratio to produce the divided clock signal. The phase comparator 7 carries out the phase comparison between the divided clock signal from the burst clock divider 6 and the phase comparison divided clock signal from the comparison clock divider 10 to output the phase comparison signal. The low pass filter 8 removes the high-frequency components in the phase comparison signal from the phase comparator 7 to produce and output the characteristic control signal for controlling a response characteristic and a synchronization characteristic. The voltage controlled oscillator 9 produces and outputs the control clock signal according to the characteristic control signal from the low pass filter 8. The comparison clock divider 10 divides the control clock signal from the voltage controlled oscillator 9 to the transmission rate equal to that of the divided clock signal to produce and output the phase comparison divided clock signal.

The clock divider 11 receives, from the transmission rate setting circuit 13 in the form of the transmission rate setting signal, the transmission rate setting information representing the transmission rate obtained by averaging the first clock signal outputted from the first clock producing circuit 4. The clock divider 11 then divides the and control clock signal from the voltage controlled oscillator 9 by the preset dividing ratio to produce and output the second clock signal for the second memory 5. The second memory 5 successively reads out the data signal to produce the processed signal by the use of the second clock signal produced at the clock divider 11. The signal processing circuit 12 carries out a predetermined processing operation with respect to the processed signal.

Through the foregoing processes, it is to be noted that, in the burst clock memory circuit, the burst clock signal is used in writing of the second memory 5 of the subject station SS upon communication with the counterpart station CS and that the first clock producing circuit 4 produces the first clock signal which is synchronous with the write clock signal CLK and has the transmission rate obtained by averaging that of the write clock signal CLK.

What is claimed is:

1. A memory circuit for processing a data signal, supplied from a counterpart station, into a processed signal supplied to a signal processing circuit, said memory circuit comprising:
   a first memory connected to said counterpart station which receives a write clock signal together with said data signal and which stores said data signal in response to said write clock signal;
   a first clock producing circuit, connected to said first memory, which produces a first clock signal that is synchronous with said write clock signal and has a transmission rate obtained by averaging that of said write clock signal, said first clock signal being supplied to said first memory to cause said first memory to output said data signal in response thereto; and
   a local processing circuit connected to said signal processing circuit, said first memory, and said first clock producing circuit, said local processing circuit receives said data signal from said first memory in response to said first clock signal and outputs said data signal at a second clock signal as said processed signal.

2. A memory circuit as claimed in claim 1, wherein said first memory produces a read enabling signal when a predetermined area of said first memory is used in storing said data signal, said first clock producing circuit producing said first clock signal in response to said read enabling signal.

3. A memory circuit as claimed in claim 1, wherein said first memory outputs said data signal per fixed storage unit in response to said first clock signal.

4. A memory circuit for processing a data signal, supplied from a counterpart station, into a processed signal supplied to a signal processing circuit, said memory circuit comprising:
   a first memory connected to said counterpart station which receives a write clock signal together with said data signal and which stores said data signal in response to said write clock signal;
   a first clock producing circuit, connected to said first memory, which produces a first clock signal that is synchronous with said write clock signal and has a transmission rate obtained by averaging that of said write clock signal, said first clock signal being supplied to said first memory to cause said first memory to output said data signal in response thereto; and
   a local processing circuit connected to said signal processing circuit, said first memory, and said first clock producing circuit, said local processing circuit receives said data signal from said first memory in response to said first clock signal and outputs said data signal at a second clock signal as said processed signal;
   wherein said local processing circuit comprises:
      a second memory connected to said first memory and said first clock producing circuit, said second memory storing said data signal output from said first memory in response to said first clock;
      a transmission rate setting circuit which sets a transmission rate and produces a transmission rate signal representative of said transmission rate; and
      a second clock producing circuit connected to said first clock producing circuit, said second memory, and said transmission rate setting circuit, said second clock producing circuit produces a second clock signal in response to said first clock signal and said transmission rate signal, said second clock signal being supplied to said second memory to cause said second memory to output said data signal as said processed signal at said second clock signal.

5. A memory circuit as claimed in claim 4, wherein said second clock producing circuit comprises:
   a burst clock divider connected to said first clock producing circuit and said transmission rate setting circuit, said burst clock divider divides said first clock signal by a preset dividing ratio to produce a divided clock signal;
   a phase comparator connected to said burst clock divider and which receives a phase comparison divided clock signal, said phase comparator compares a phase between said divided clock signal and said phase comparison divided clock signal to produce a phase comparison signal;
   a low pass filter connected to said phase comparator which removes high-frequency components from said phase comparison signal to produce a characteristic control signal;
   a voltage controlled oscillator connected to said low pass filter which produces a control clock signal in response to said characteristic control signal;
   a comparison clock divider connected to said voltage controlled oscillator and said phase comparator, said comparison clock divider divides said control clock signal so that said control clock signal has a transmission rate equal to that of said divided clock signal, thereby producing said phase comparison divided clock signal; and
   a clock divider connected to said voltage controlled oscillator and said transmission rate setting circuit, said clock divider divides said control clock signal by said preset dividing ratio to produce said second clock signal.

* * * * *